United States Patent
Hayashi (10) Patent No.: US 7,727,899 B2
(45) Date of Patent: Jun. 1, 2010

(54) MANUFACTURING METHOD OF SEMICONDUCTOR DEVICE AND SEMICONDUCTOR STORAGE DEVICE INCLUDING FINE CONTACT HOLES

(75) Inventor: Hisataka Hayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 657 days.

(21) Appl. No.: 11/783,236

(22) Filed: Apr. 6, 2007

(65) Prior Publication Data

US 2007/0254472 A1 Nov. 1, 2007

(30) Foreign Application Priority Data

Apr. 6, 2006 (JP) .............................. 2006-105741

(51) Int. Cl.
*H01L 21/302* (2006.01)
(52) U.S. Cl. ............................... 438/736; 257/E21.258
(58) Field of Classification Search ................ 438/700, 438/703, 637, 631, 671, 675, 551, 552, 736, 438/942, 638, 668, 666; 257/E21.486, E21.314, 257/E21.346, E21.474, E21.24, E21.232, 257/E21.231, E21.258, E21.257
See application file for complete search history.

(56) References Cited

U.S. PATENT DOCUMENTS

| 5,966,634 | A * | 10/1999 | Inohara et al. ............... 438/687 |
| 6,204,187 | B1 * | 3/2001 | Rupp et al. .................. 438/702 |
| 6,303,272 | B1 * | 10/2001 | Furukawa et al. ........... 430/314 |
| 6,420,257 | B2 * | 7/2002 | Ireland ........................ 438/618 |
| 6,649,526 | B2 * | 11/2003 | Yang ........................... 438/700 |
| 6,835,666 | B2 * | 12/2004 | Popp ........................... 438/735 |
| 6,943,453 | B2 | 9/2005 | Goda et al. |

(Continued)

FOREIGN PATENT DOCUMENTS

JP 09-153545 6/1997

(Continued)

OTHER PUBLICATIONS

Japanese Patent Office Notification of Reasons For Rejection issued in copending Application No. 2006-105741 (mailed Apr. 11, 2008) and English language translation thereof.

(Continued)

*Primary Examiner*—W. David Coleman
*Assistant Examiner*—Latanya Crawford
(74) *Attorney, Agent, or Firm*—Finnegan, Henderson, Farabow, Garrett & Dunner, L.L.P.

(57) ABSTRACT

A manufacturing method of a semiconductor device is carried out as follows. A first mask layer having a first linear opening pattern is formed above the first interlayer insulating layer. A second mask layer having a plurality of second linear opening patterns and first dummy opening patterns is formed above the first mask layer. The plurality of second linear opening patterns are aligned above the first linear opening pattern at given intervals to cross the first linear opening pattern. The first dummy opening patterns are arranged in close proximity to a first pattern remaining region that is present between the second linear opening patterns adjacent to each other. The first interlayer insulating layer that is present below opening patterns obtained by overlap portions of the first linear opening pattern and the second linear opening patterns is etched to form holes.

20 Claims, 10 Drawing Sheets

U.S. PATENT DOCUMENTS

| | | | |
|---|---|---|---|
| 7,071,097 B2 * | 7/2006 | Colburn | 438/637 |
| 7,119,010 B2 * | 10/2006 | Lim et al. | 438/638 |
| 2002/0068243 A1 * | 6/2002 | Hwang et al. | 430/312 |
| 2005/0067710 A1 * | 3/2005 | Lytle et al. | 257/774 |
| 2005/0103441 A1 | 5/2005 | Honda et al. | |

FOREIGN PATENT DOCUMENTS

| | | |
|---|---|---|
| JP | 2000-357736 | 12/2000 |
| KR | 10-0253852 | 5/2000 |

OTHER PUBLICATIONS

Notification for Filing Opinion mailed Jul. 25, 2008, for co-pending Korean App. No. 10-2007-33710 and English translation thereof.

\* cited by examiner

MANUFACTURING METHOD OF SEMICONDUCTOR DEVICE AND SEMICONDUCTOR STORAGE DEVICE INCLUDING FINE CONTACT HOLES

CROSS-REFERENCE TO RELATED APPLICATIONS

This application is based upon and claims the benefit of priority from prior Japanese Patent Application No. 2006-105741, filed Apr. 6, 2006, the entire contents of which are incorporated herein by reference.

BACKGROUND OF THE INVENTION

1. Field of the Invention

The present invention relates to a manufacturing method of a semiconductor memory device and a semiconductor device, for example, a forming method of fine contact holes continuously aligned in a semiconductor memory device.

2. Description of the Related Art

In recent years, with a demand for a reduction in size and realization of high functions of a semiconductor device, miniaturization of, e.g., a interconnection contact in a semiconductor device has been developed. In a lithography step in manufacture of a semiconductor device, it is known that a linear opening pattern rather than a hole pattern enables forming an elaborate finer pattern because of lithography characteristics. Therefore, by utilizing such characteristics, when forming a fine contact hole a so-called double transfer exposure technology or cross-point exposure technology is used (see, e.g., Jpn. Pat. Appln. KOKAI Publication No. 2000-357736 (FIG. 3)). According to this technology, mask layers having linear opening patterns formed therein are superimposed on, e.g., an interlayer insulating layer in such a manner that the linear opening patterns become perpendicular to each other, and an interlayer insulating layer or the like below opening crossing parts of the patterns perpendicular to each other is etched to form each contact hole.

However, in case of exploiting this technology to form each fine contact hole in a semiconductor device, a problem that a fine contact hole is distorted occurs when a resist of, e.g., an organic film is used as a mask to perform etching.

BRIEF SUMMARY OF THE INVENTION

According to a first aspect of the present invention, there is provided a manufacturing method of a semiconductor device, comprising: forming a first mask layer having a first linear opening pattern above a first interlayer insulating layer; forming a second mask layer having a plurality of second linear opening patterns and first dummy opening patterns above the first mask layer, the plurality of second linear opening patterns being aligned above the first linear opening pattern at given intervals to cross the first linear opening pattern, the first dummy opening patterns being arranged in close proximity to a first pattern remaining region that is present between the second linear opening patterns adjacent to each other; and etching the first interlayer insulating layer that is present below opening patterns obtained by overlap portions of the first linear opening pattern and the second linear opening patterns to form holes.

According to a second aspect of the present invention, there is provided a manufacturing method of a semiconductor device, comprising: forming a first mask layer having a first linear opening pattern above a first interlayer insulating layer; forming a second interlayer insulating layer above the first interlayer insulating layer below the first linear opening pattern and above the first mask layer; forming a second mask layer having a plurality of interconnection groove opening patterns and dummy opening patterns above the second interlayer insulating layer, the plurality of interconnection groove opening patterns being aligned above the first linear opening pattern at given intervals to cross the first linear opening pattern, the dummy opening patterns being arranged in close proximity to a pattern remaining region that is present between the interconnection groove opening patterns adjacent to each other; and etching the second interlayer insulating layer below the interconnection groove opening patterns to form interconnection grooves, and etching the first interlayer insulating layer that is present below opening patterns obtained by overlap portions of the first linear opening pattern and the interconnection groove opening patterns to form holes.

According to a third aspect of the present invention, there is provided a manufacturing method of a semiconductor memory device, comprising: forming a memory cell array on a semiconductor substrate; forming a first interlayer insulating layer above the semiconductor substrate having the memory cell array thereon; forming a first mask layer having a first linear opening pattern above the first interlayer insulating layer; forming a second mask layer having a plurality of second linear opening patterns and first dummy opening patterns above the first mask layer, the second linear opening patterns intersecting the first linear opening pattern when viewed from above, the first linear opening pattern and the second linear opening patterns being arranged such that overlap portions as viewed from above correspond to a position where contact plugs are formed on the memory cell array, the first dummy opening patterns being arranged in close proximity to a pattern remaining region that is present between the second linear opening patterns adjacent to each other; and etching those portions of the first interlayer insulating layer which are present at the overlap portions between the first linear opening pattern and the second linear opening patterns, to form contact holes.

DETAILED DESCRIPTION OF THE INVENTION

The present invention can be particularly effectively applied to formation of a plurality of fine contact holes that are arranged in parallel in a semiconductor device, e.g., an NAND type EEPROM or an NOR type EEPROM. Thus, in the following embodiments, examples where contact holes, contact plugs, and interconnection layers are formed in an NAND type EEPROM will be explained in detail with reference to the accompanying drawings.

Embodiment 1

Figure 1:
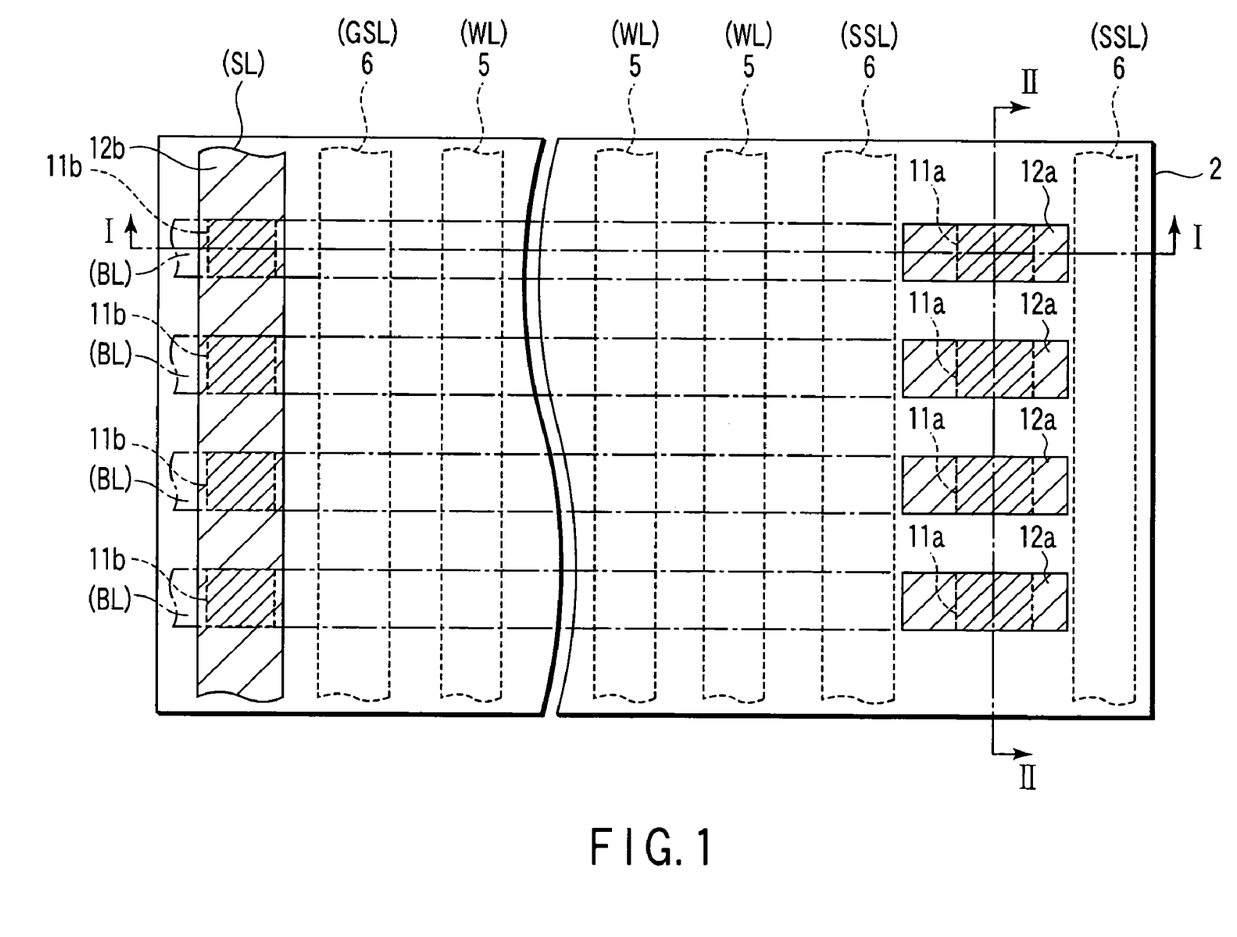
FIG. 1 is a plan view of a cell array in an NAND type EEPROM.
Figure 2:
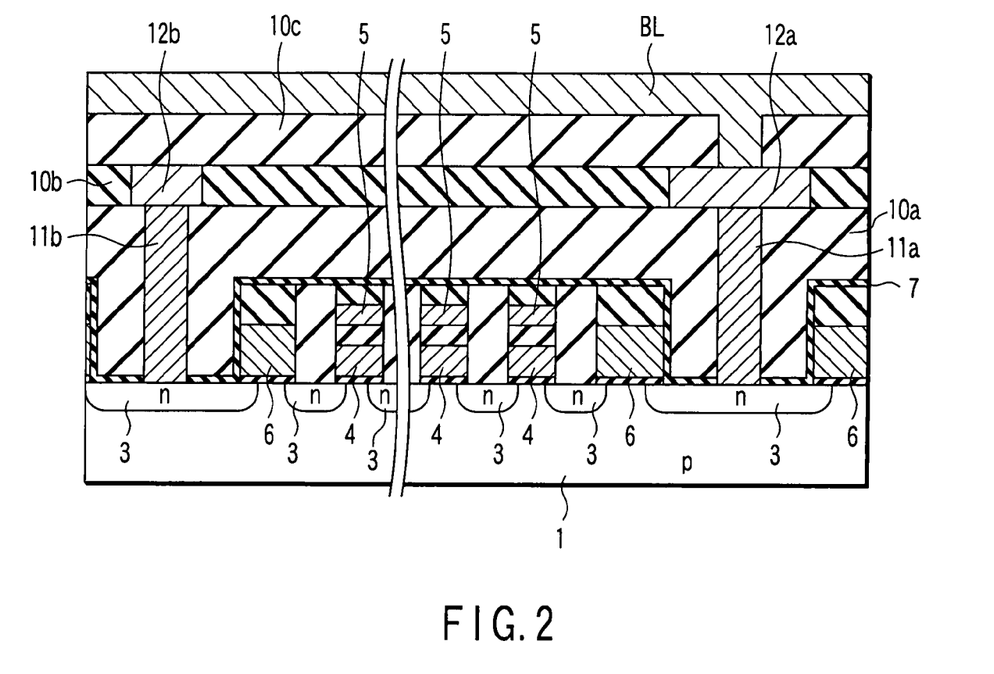
FIG. 2 is a cross-sectional view of the cell array in the NAND type EEPROM.
Figure 3:
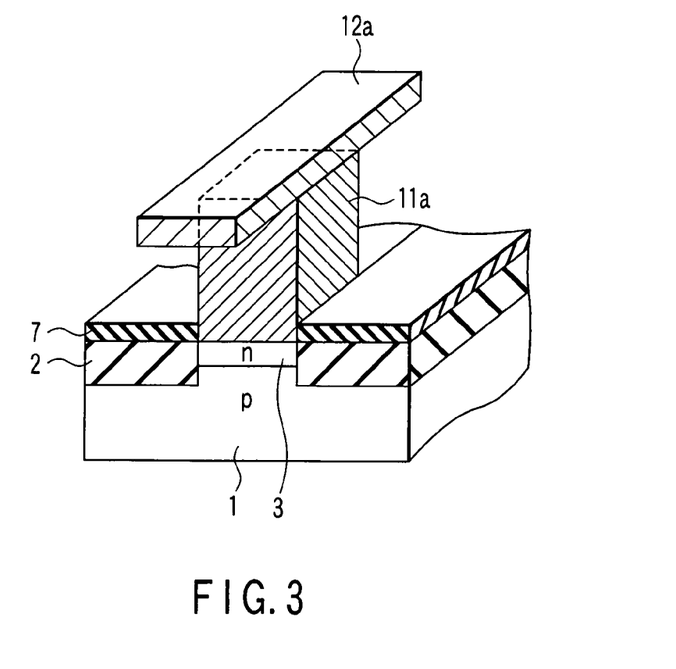
FIG. 3 is a perspective view of a contact plug and an interconnection layer in the NAND type EEPROM.

A structural example of an NAND type EEPROM will be first explained with reference to FIGS. 1 to 3. FIG. 1 is a plan view of a cell array in the NAND type EEPROM. FIG. 2 is a cross-sectional view taken along a line I-I in FIG. 1. FIG. 3 is a perspective view of a contact plug 11a and an interconnection layer 12a on a drain side that are depicted excluding a peripheral insulating layer and others.

As shown in FIG. 2, a cell array is formed on a p-type well region of a silicon substrate 1. An n-type diffusion layer 3 is formed in a surface layer portion in the p-type well region of the silicon substrate 1. The n-type diffusion layer 3 functions as a source or a drain of each of a plurality of non-volatile memory cells. The memory cell has a gate structure where a floating gate 4 and a control gate 5 are superimposed through an inter-electrode insulating film. Further, the plurality of memory cells are arranged in series in close proximity to each other to constitute an NAND type cell unit. As shown in FIG. 1, the control gates 5 are continuously formed into a pattern in one direction as word line WL. Selection transistors are formed at both ends of the NAND type cell unit, and gate electrodes 6 thereof are continuously formed into a pattern in one direction as control gate lines SSL and GSL parallel with the word lines WL.

The n-type diffusion layers 3 at a drain side end and a source side end in the NAND type cell unit are respectively connected with interconnection layers 12a and 12b formed in a second interlayer insulating layer 10b through contact plugs 11a and 11b formed in the first interlayer insulating layer 10a. Each of the contact plugs 11a and 11b is formed by embedding a conductive layer of, e.g., polycrystal silicon in which an impurity, e.g., a phosphor ion is doped at a high concentration or aluminum, copper or tungsten in each contact hole. Furthermore, a conductive layer of, e.g., aluminum, copper, or tungsten is embedded in each of the interconnection layers 12a and 12b.

As shown in FIG. 3, the interconnection layer 12a has a rectangular solid shape extending long in a bit line BL direction, serves as a leader interconnection line (a relay interconnection line) for the bit line BL, and connected with the bit line BL formed on a third interlayer insulating layer 10c. Moreover, along a line II-II in FIG. 1, the plurality of contact plugs 11a and interconnection layers 12a are arranged in parallel through an element isolating region 2 in the word line WL direction. The interconnection layer 12b serves as a common source line SL extending in the word line WL direction, and is shared through the contact plugs 11b by the plurality of n-type diffusion layers 3 at the source side ends that are arranged in parallel through the element isolating region 2 in the word line WL direction.

This is the simplified structural example of the NAND type EEPROM. How to form the plurality of contact plugs 11a and interconnection layers 12a arranged in the word line WL direction by using a manufacturing method of a semiconductor device according to Embodiment 1 will now be explained with reference to FIGS. 4A to 4D, 5A, 5B, and 6A to 6C. FIGS. 4A to 4D, 5A, 5B, and 6A to 6C are perspective views showing forming steps of fine contact holes, the contact plugs 11a, and the interconnection layers 12a along a part of an alternate long and short dash line I-I in FIG. 1 based on the manufacturing method of a semiconductor device according to this embodiment.

Figure 4A:
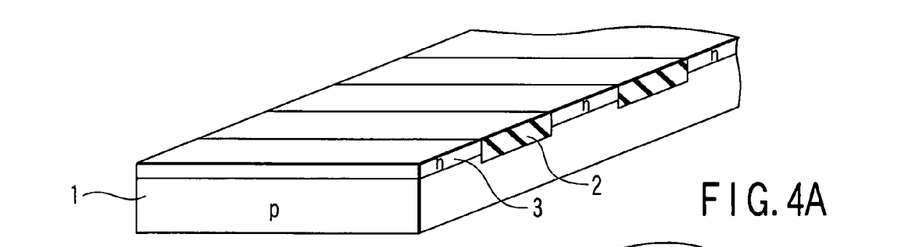
FIGS. 4A, 4B, 4C, and 4D are cross-sectional views of a first step showing a manufacturing method of a semiconductor device according to Embodiment 1 of the present invention.

A forming step of each fine contact hole will first be explained with reference to FIGS. 4A to 4D. As shown in FIG. 4A, a p-type well region of the silicon substrate 1 is partitioned into a plurality of stripe element regions each having a width of approximately 90 nm by element isolating regions 2 made of, e.g., $SiO_2$ formed by an STI (Shallow Trench Isolation) method and the like. Specifically, a part of the silicon substrate 1 where the element regions are formed is masked in a stripe pattern by using an $SiO_2$ film or an $Si_3N_4$ film, and the silicon substrate 1 is trench-etched by RIE (Reactive Ion Etching). Then, a CVD (Chemical Vapor Deposition) method is used to deposit an $SiO_2$ film on the silicon substrate 1 having a trench portion formed into a stripe pattern and on the $SiO_2$ film or the $Si_3N_4$ film on the silicon substrate. Additionally, CMP (Chemical Mechanical Polishing) is used to polish and remove the $SiO_2$ film and the $Si_3N_4$ film except the trench portion, and the silicon substrate 1 is thereby exposed to form the element regions. Here, the respective element regions are aligned, with a space of approximately 90 nm being provided therebetween. Subsequently, such a stacked gate structure as shown in, e.g., FIG. 2 is formed, and then a phosphor ion or the like is implanted in the respective element regions on both sides of the stacked gate structure to form the n-type diffusion layers 3.

Figure 4B:
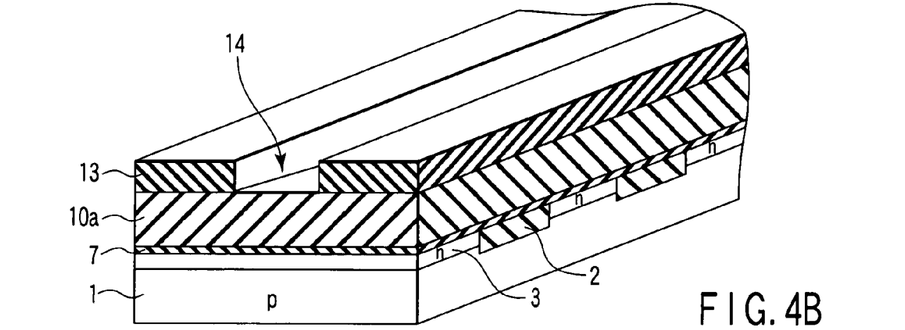

Then, as shown in FIG. 4B, a barrier insulating film 7 is formed on the silicon substrate 1 having the n-type diffusion layers 3 formed thereon. Further, the first interlayer insulating layer 10a is formed on the barrier insulating film 7. The barrier insulating film 7 is an etching stopper layer that prevents a withstand voltage defect from occurring between the contact and the p-type well region of the silicon substrate 1 when etching controllability is insufficient in formation of each contact hole and each contact hole thereby falls in the element isolating region 2. This barrier insulating film 7 must have an etching selectivity with respect to the first interlayer insulating layer 10a. That is, the barrier insulating film 7 must be a film that is hard to be etched when etching the first interlayer insulating layer 10a. As the barrier insulating film 7, for example, a silicon nitride film, a silicon oxynitride film, or an aluminum oxide film can be used.

Furthermore, before depositing the barrier insulating film 7, an oxide film may be formed based on oxidation of the silicon substrate or a silicon oxide film may be formed by the CVD method as the buffer insulating film. As a material of the first interlayer insulating layer 10a, a silicon oxide film, silicate glass, e.g., BPSG (boron phosphor silicate glass) or PSG (phosphor silicate glass), HSQ (Hydrogen Silsesquioxane), or SiLK (manufactured by Dow Chemical Company) is used.

A first mask layer 13 having a silicon nitride film, a silicon oxynitride film, or an aluminum oxide film as a material is further formed on the first interlayer insulating layer 10a. Since the first mask layer 13 functions as a mask when etching the first interlayer insulating layer 10a to form each contact hole, it must have an etching selectivity with respect to the first interlayer insulating layer 10a. That is, the first mask layer 13 must be a film that is hard to be etched when etching the first interlayer insulating layer 10a.

Figure 7:
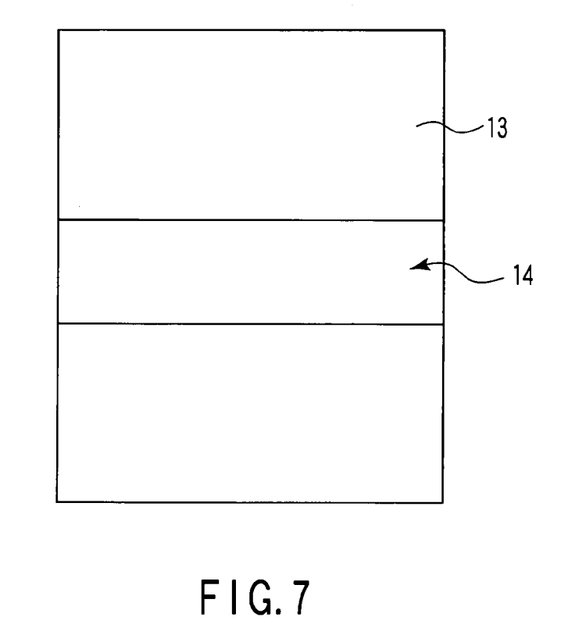
FIG. 7 is a plan view of a first mask layer used in the manufacturing method of a semiconductor device according to Embodiment 1.

Moreover, a first linear opening pattern 14 extending in the word line WL direction is formed in the first mask layer 13 by, e.g., a photolithography method. Here, FIG. 7 shows a plan view of the first mask layer 13 having the first linear opening pattern 14 formed therein. Since a width of the first linear opening pattern 14 becomes a width between two opposed sides of each rectangular contact hole to be formed (between two sides parallel with the word line WL direction), it is set in accordance with a desired length. In this embodiment, a width of this opening pattern is set to approximately 90 nm.

Figure 4C:
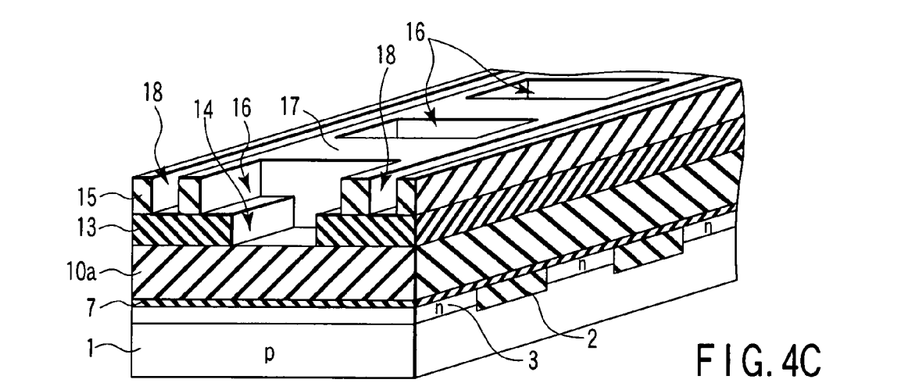

Then, as shown in FIG. 4C, a photoresist film serving as a second mask layer 15 is formed on the first interlayer insulating layer 10a and the first mask layer 13. Since the second mask layer 15 functions as a mask when etching the first interlayer insulating layer 10a to form each contact hole, it must have an etching selectivity with respect to the first interlayer insulating layer 10. That is, the second mask layer 15 must be a film that is hard to be etched when etching the first interlayer insulating layer 10a.

Here, a plurality of second linear opening patterns 16 that are perpendicular to the first linear opening pattern 14 are aligned and formed in the second mask layer 15 by the photolithography method. At the same time, each dummy opening pattern 18 extending in the word line WL direction is formed in close proximity to an end of a part (which will be referred to as a pattern remaining region) 17 where the photoresist film remains between the second linear opening patterns 16.

Figure 8:
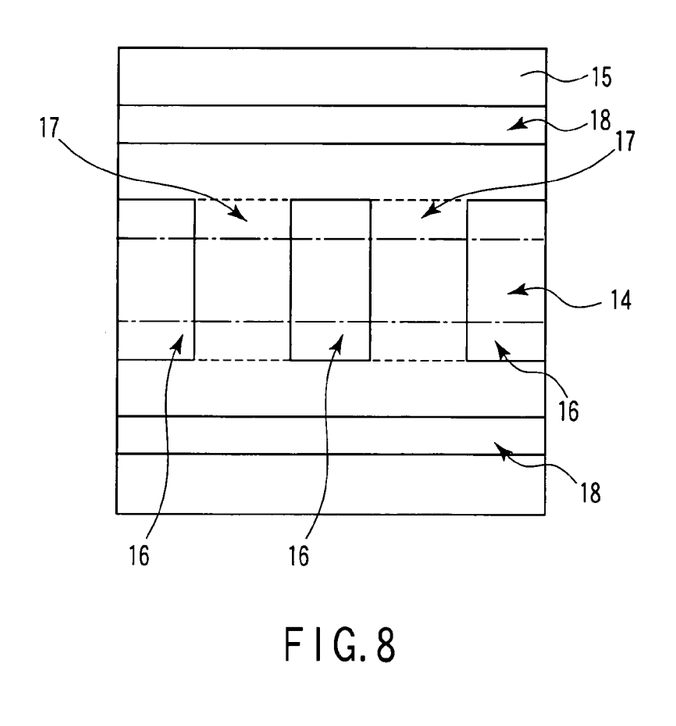
FIG. 8 is a plan view of a second mask layer used in the manufacturing method of a semiconductor device according to Embodiment 1.

FIG. 8 is a plan view showing the second mask layer 15 having the second linear opening patterns 16 and the dummy opening patterns 18 formed therein. Additionally, as indicated by broken line parts in FIG. 8, each region between the second linear opening patterns 16 adjacent to each other indicates the pattern remaining region 17. Since a width of the second linear opening pattern 16 is a width between two opposed sides of each rectangular contact hole (between two sides parallel with the bit line BL direction), it is set in accordance with a desired length. In this embodiment, this pattern width is set to be substantially equal to a width of each element isolating region, it is set to approximately 90 nm.

Further, in this embodiment, the dummy opening patterns 18 are formed as a pair of linear opening patterns to sandwich all the second linear opening patterns 16 and all the pattern remaining regions 17 in close proximity to both sides of ends of the pattern remaining regions 17 (both sides of the pattern remaining regions 17 in the bit line BL direction) between the second linear opening patterns 16.

Figure 4D:
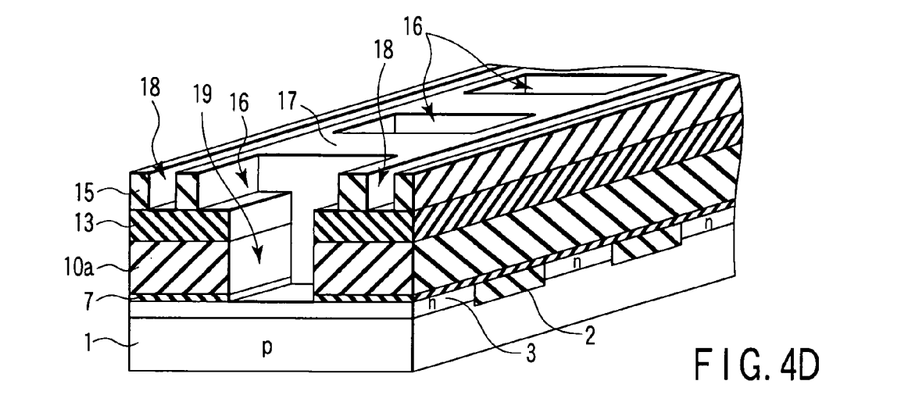

Then, as shown in FIG. 4D, the first interlayer insulating layer 10a and the barrier insulating film 7 below the opening patterns that are not masked by the first mask layer 13 and the second mask layer 15 are respectively selectively etched by anisotropic etching, e.g., RIE to form each fine contact hole 19. The opening pattern that is not masked means an overlap portion formed by superimposition of the first linear opening pattern 14 and the second linear opening pattern 16.

Here, according to the manufacturing method of a semiconductor device of this embodiment, since each dummy opening pattern 18 is formed in close proximity to the pattern remaining region 17 between the second linear opening patterns 16, a stress concentrated on the pattern remaining region 17 due to thermal expansion of the second mask layer 15 can be effectively transmitted to each dummy opening pattern 18 that is close to the pattern remaining region 17 when etching the first interlayer insulating layer 10a and the barrier insulating film 7. Therefore, each second linear opening pattern 16 can be prevented from being distorted, and each fine contract hole 19 having a desired shape with less distortion can be formed.

Figure 5A:
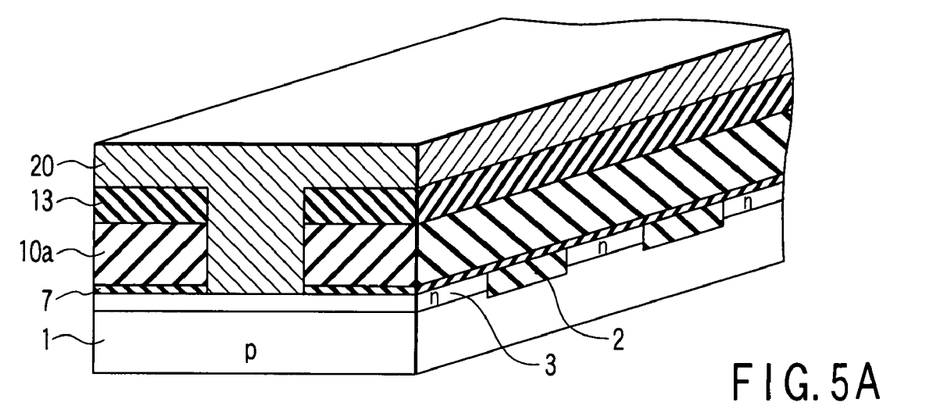
FIGS. 5A and 5B are cross-sectional views of a second step showing the manufacturing method of a semiconductor device according to Embodiment 1.

A forming method of each contact plug 11a after formation of each contact hole 19 will now be explained with reference to FIGS. 5A and 5B. First, as shown in FIG. 5A, the photoresist film as the second mask layer 15 is ashed, and then a conductive layer 20 formed of a metal material, e.g., tungsten, aluminum, or copper is embedded in the contact hole 19 through a barrier metal (not shown), e.g., Ti, Ta, TaN, or TiN. The barrier metal and the conductive layer 20 are formed by, e.g., a CVD method or a sputtering method. Furthermore, in place of embedding the metal material in the contact hole 19, the conductive layer 20 of, e.g., polycrystal silicon in which an impurity, e.g., phosphor is doped at a high concentration can be embedded.

Figure 5B:
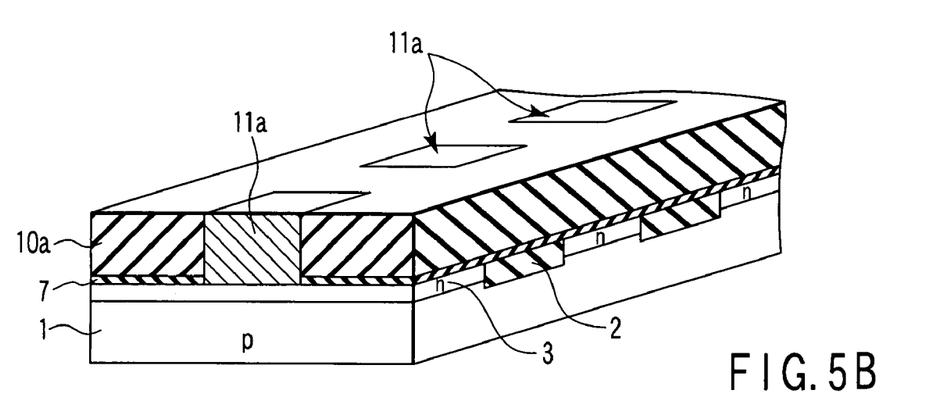

Moreover, as shown in FIG. 5B, the conductive layer 20 and the first mask layer 13 provided at positions except the inside of each contact hole 19 are sequentially polished and removed by CMP to expose the first interlayer insulating layer 10a, and the contact plugs 11a that are aligned at fine intervals in the word line WL direction are thereby formed.

A forming method of the interconnection layers 12a serving as relay electrodes with respect to the contact plugs 11a and the bit lines BL will now be explained with reference to FIGS. 6A, 6B, and 6C.

Figure 6A:
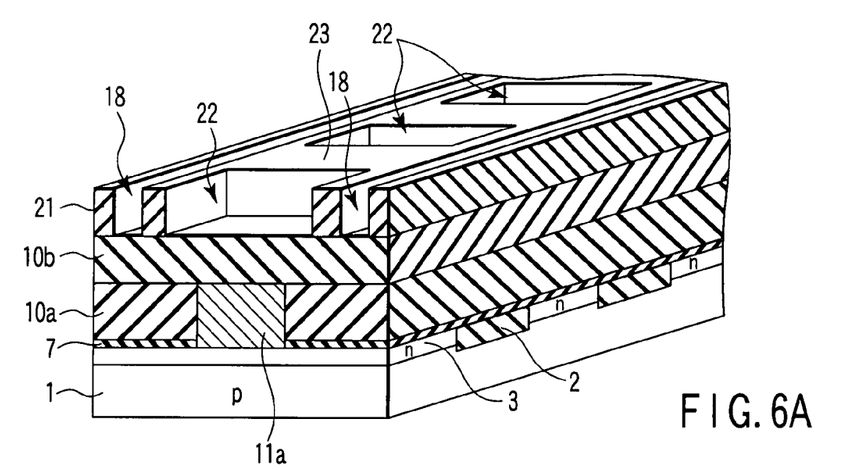
FIGS. 6A, 6B, and 6C are cross-sectional views of a third step showing the manufacturing method of a semiconductor device according to Embodiment 1.

First, as shown in FIG. 6A, a second interlayer 10b is formed on the first interlayer insulating layer 10a and the contact plugs 11a. Here, the second interlayer insulating layer 10b is made up of a material having an etching selectivity with respect to the first interlayer insulating layer 10a. Furthermore, a photoresist film serving as an interconnection pattern formation mask layer 21 is formed on the second interlayer insulating layer 10b. A plurality of linear interconnection groove opening patterns 22 are formed in the interconnection pattern formation mask layer 21 in parallel. At this time, the interconnection groove opening patterns 22 are located above the contact plugs 11a and are arranged to overlap the contact plugs 11a.

Moreover, as shown in FIG. 6A, a gap between the interconnection groove opening patterns 22 becomes very small, and stress resistance properties of each pattern remaining region 23 between the interconnection groove opening patterns 22 are deteriorated. Therefore, the dummy opening patterns 18 are formed in close proximity to ends of each pattern remaining region 23 between the interconnection groove opening patterns 22. As a result, a stress applied to the pattern remaining region 23 at the time of etching is alleviated. Here, the dummy opening patterns 18 are formed as a pair of linear opening patterns to sandwich all the interconnection groove opening patterns 22 and all the pattern remaining regions 23 in close proximity of both end sides of the pattern remaining regions 23 between the interconnection groove opening patterns 22.

Figure 6B:
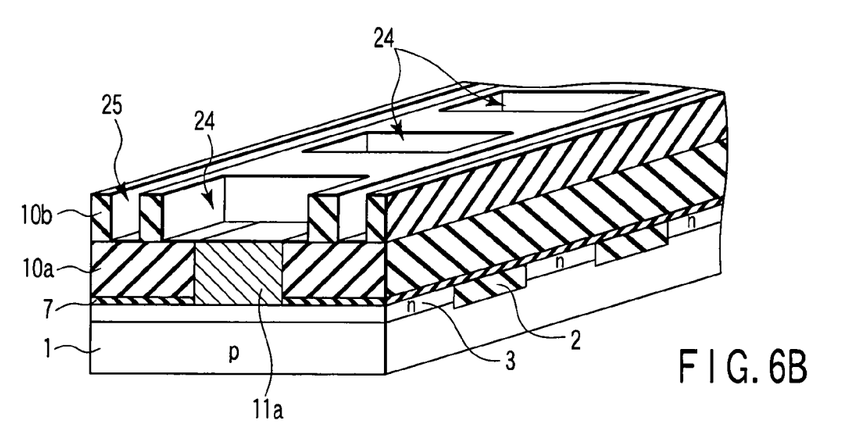
Figure 6C:
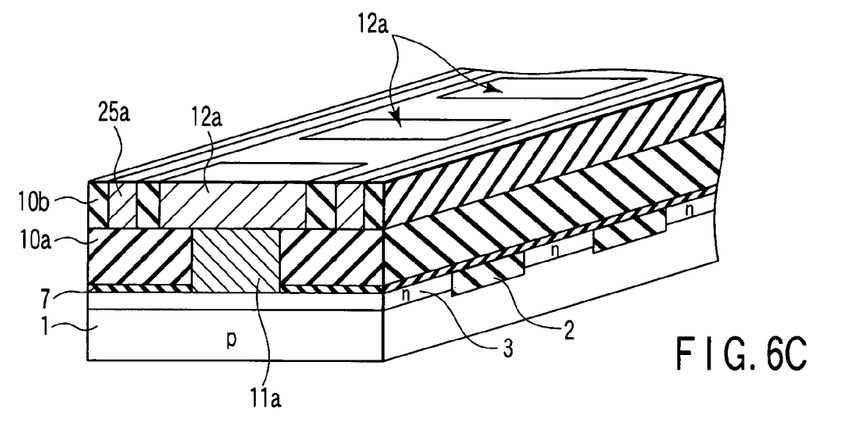

Then, as shown in FIG. 6B, the second interlayer insulating layer 10b below the interconnection groove opening patterns 22 that are not masked by the resist film 21 is etched by anisotropic etching, e.g., RIE to form interconnection grooves 24 in the second interlayer insulating layer 10b. Subsequently, the resist film 21 is removed. Additionally, like FIG. 5A, a conductive layer is formed on the second interlayer insulating layer 10b, the exposed first interlayer insulating layer 10a, and the contact plugs 11a. Then, like FIG. 5B, the conductive layer above the interconnection grooves 24 is polished and removed by CMP to exposure the second interlayer insulating layer 10b, thereby forming interconnection layers 12a electrically connected with the contact plugs 11a.

Further, at this time, a conductive layer is embedded in grooves 25 in the second interlayer insulating layer 10b formed below the dummy opening pattern 18 in the interconnection pattern formation mask layer 21 to form an embedded layers 25a of the conductive layer. However, this embedded layer 25a is not a part having a function of a semiconductor device, especially an electrical function. Therefore, this embedded layer 25a is formed as a floating layer that is electrically insulated from the interconnection layers 12a or the bit lines BL by, e.g., covering the upper side of this embedded layer 25a with an insulating layer.

As explained above, according to the manufacturing method of a semiconductor device of this embodiment, the following effects can be obtained. According to a conventional technology, mask layers each having a plurality of linear opening patterns aligned and formed therein are superimposed and formed on an interlayer insulating layer in such a manner that the patterns become perpendicular to each other, and the interlayer insulating layer below each opening intersecting portion of both the patterns is etched to form each contact hole. However, in this case, a gap between the contact holes is narrowed when a reduction in size of a semiconductor device advances, and a width of each of a plurality of pattern remaining regions formed in the mask layers becomes very narrow, thereby considerably deteriorating stress resistance properties of each pattern remaining region. Therefore, a stress is concentrated on each pattern remaining region due to, e.g., thermal expansion of the mask layers at the time of etching, and each pattern remaining region is distorted, thus deforming a pattern shape. As a result, a shape of each contact hole is distorted, and each desired fine contact hole shape cannot be formed. In particular, when a pattern line width is not greater than approximately 90 nm, such a tendency is prominent.

On the other hand, in the manufacturing method of a semiconductor device according to this embodiment, each dummy opening pattern 18 is formed in the second mask layer 15 having the plurality of linear opening patterns 16 that are aligned and arranged at fine intervals in close proximity to each pattern remaining region 17 between the linear opening patterns 16. As a result, a stress concentrated on each pattern remaining region 17 due to thermal expansion of the second mask layer 15 when etching the first interlayer insulating layer 10a can be transmitted to the adjacent dummy opening pattern 18.

Furthermore, the dummy opening pattern 18 having a function of alleviating the stress applied to each pattern remaining region 23 is also formed in the interconnection pattern formation mask layer 21 having the plurality of linear interconnection groove opening patterns 22 in close proximity to each pattern remaining region 23 between the interconnection groove opening patterns 22. Therefore, the stress concentrated on each pattern remaining region 23 due to thermal expansion of the interconnection pattern formation mask layer 21 at the time of etching the second interlayer insulating layer 10b can be transmitted to the adjacent dummy opening pattern 18.

As explained above, in Embodiment 1, when the stresses applied to each pattern remaining region 17 of the second mask layer 15 and each pattern remaining region 23 of the interconnection pattern formation mask layer 21 at the time of etching the first and the second interlayer insulating layers 10a and 10b are reduced, distortions of the second linear opening patterns 16 in the second mask 15 and the interconnection groove opening patterns 22 in the interconnection pattern formation mask 21 are suppressed, thereby forming each fine contact hole 19, each contact plug 11a, and each interconnection layer 12a having a desired shape with less distortion. In a semiconductor device in which a plurality of fine contact holes and interconnection layers are linearly and regularly aligned, e.g., an NAND type EEPROM in particular, the manufacturing method of a semiconductor device according to this embodiment that enables formation of each fine contact hole, each contact plug, and each interconnection layer is effective with less distortion.

Embodiment 2

How to form each fine contact hole, each contact plug, and each interconnection layer by using a manufacturing method of a semiconductor device according to Embodiment 2 of the present invention will now be explained with reference to the accompanying drawings. However, in this embodiment, since fine contact holes and others are formed at substantially the same steps as those in the manufacturing method of a semiconductor device according to Embodiment 1, thereby omitting a detailed explanation of the same steps.

How to form each fine contact hole by the manufacturing method of a semiconductor device according to this embodiment will be first explained with reference to FIGS. 4A to 4D like Embodiment 1. As shown in FIGS. 4A and 4B, a first interlayer insulating layer 10a is formed on a silicon substrate 1 having a stripe n-type diffusion layer 3 through a barrier insulating film 7. Moreover, a photoresist film as a first mask layer 13 is formed on the first interlayer insulating layer 10a. Additionally, a first linear opening pattern 14 is formed in the photoresist film by a photolithography method.

Then, as shown in FIG. 4C, a photoresist film as a second mask layer 15 is formed on the first mask layer 13 and the first interlayer insulating layer 10a. A plurality of second linear opening patterns 16 that are perpendicular to the first linear opening pattern 14 are aligned and formed in the second mask layer 15. Additionally, linear dummy opening patterns 18 are formed at both ends of each pattern remaining region 17 between the second linear opening patterns 16 in close proximity to the second linear opening patterns 16.

Here, although the second linear opening patterns 16 and the dummy opening patterns 18 are formed by the lithography method, the second linear opening patterns 16 and the dummy opening patterns 18 are prevented from being formed in the first mask layer 13 by this lithography method. For example, a negative type photoresist film is used for the first mask layer 13, and a positive type photoresist film is used for the second mask layer 15.

Then, as shown in FIG. 4D, the first interlayer insulating layer 10a and the barrier insulating film 7 that are not masked by the first mask layer 13 and the second mask layer 15 are respectively selectively etched by anisotropic etching, e.g., RIE to form each contact hole 19. At this moment, a stress concentrated on each pattern remaining region between the second linear opening patterns 16 is alleviated by each dummy opening pattern 18 when etching the first interlayer insulating layer 10a and the barrier insulating film 7, thereby avoiding a distortion of the second linear opening patterns 16.

Therefore, the fine contact holes 19 that are formed to be aligned in the word line WL direction can be formed with a desired shape and a size, and they can correspond respectively to the plurality of element regions that are formed in a stripe pattern in the silicon substrate 1.

Figure 9A:
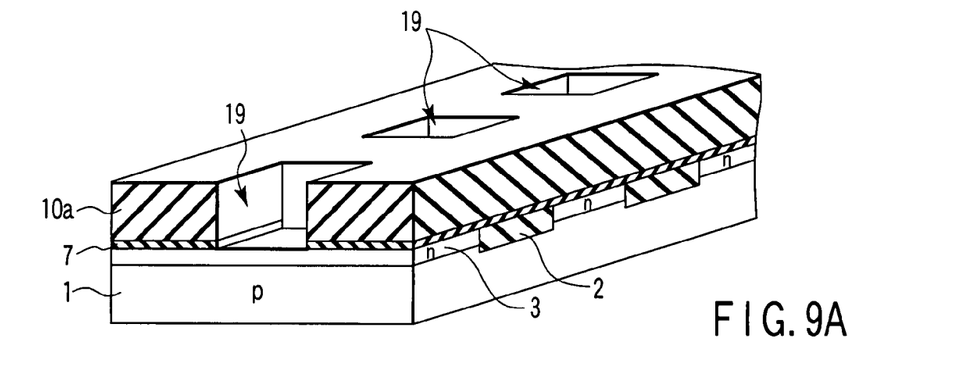
FIGS. 9A, 9B, and 9C are cross-sectional views of steps showing a manufacturing method of a semiconductor device according to Embodiment 2 of the present invention.
Figure 9B:
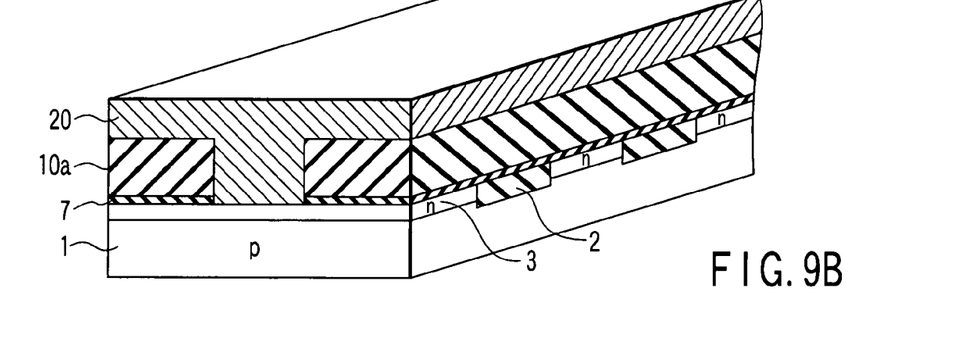
Figure 9C:
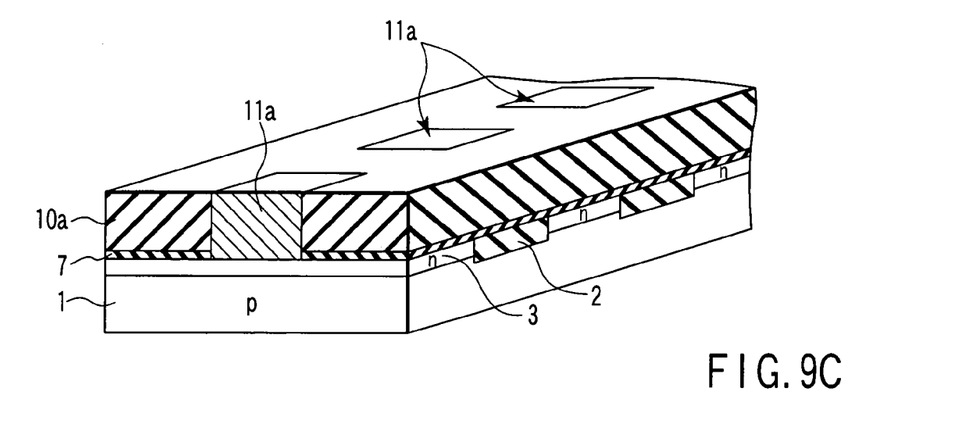

A method of forming each contact plug 11a will now be explained with reference to FIGS. 9A, 9B, and 9C. FIGS. 9A to 9C are perspective views showing a forming method of each contact plug 11a in a part of a cross section taken along a line I-I in FIG. 1.

First, as shown in FIG. 9A, the first mask layer 13 and the second mask layer 15 formed on the first interlayer insulating layer 10a are respectively ashed. Further, as shown in FIG. 9B, a conductive layer 20 is embedded in each contact hole 19 through a barrier metal (not shown). Here, like Embodiment 1, as the barrier metal, Ti, Ta, TaN, or TiN is used. Furthermore, as the conductive layer 20, a metal material, e.g., aluminum or a polycrystal silicon layer in which an impurity is doped is used like Embodiment 1.

Moreover, as shown in FIG. 9C, the conductive layer 20 provided positions except each contact hole 19 is polished and removed by CMP to expose the first interlayer insulating layer 10a, thereby forming each contact plug 11a.

It is to be noted that a forming method of an interconnection layer 12a based on the manufacturing method of a semiconductor device according to this embodiment is the same as the forming method of the interconnection layer 12a described in conjunction with Embodiment 1, thereby omitting an explanation thereof.

In this embodiment, a photoresist film is used for the first mask layer 13 as different from Embodiment 1. Therefore, in this embodiment, removal of the first mask layer 13 at a step of forming each contact plug 11a does not have to be carried out by polishing like Embodiment 1, and it can be readily carried out based on ashing like the second mask layer 15. That is, in this embodiment, performing polishing at the step of forming each contact plug 11a with respect to the conductive layer 20 except each contact hole 19 can suffice. Therefore, a polishing amount can be reduced as compared with Embodiment 1, thereby readily forming each contact plug 11a.

Embodiment 3

How to form each fine contact hole, each contact plug, and each interconnection layer based on the manufacturing method of a semiconductor device according to Embodiment 3 of the present invention will be explained with reference to the accompanying drawings. However, in this embodiment, the fine contact holes and others are formed at the steps that are partially the same as those in the manufacturing method of a semiconductor device according to Embodiment 1 or Embodiment 2, thereby omitting a detailed explanation of the same steps.

Figure 10A:
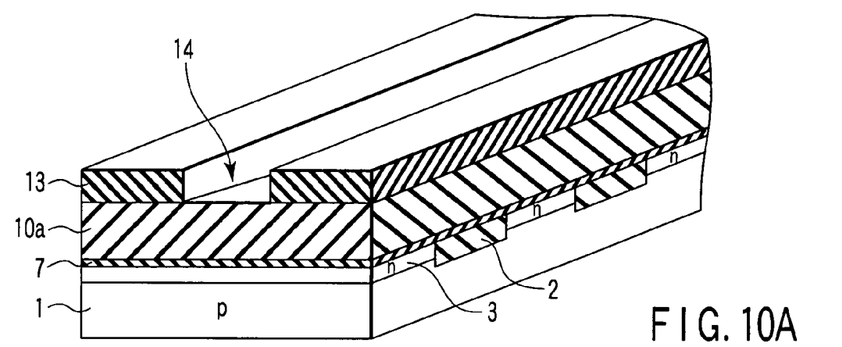
FIGS. 10A, 10B, and 10C are cross-sectional views of a first step showing a manufacturing method of a semiconductor device according to Embodiment 3 of the present invention.
Figure 10B:
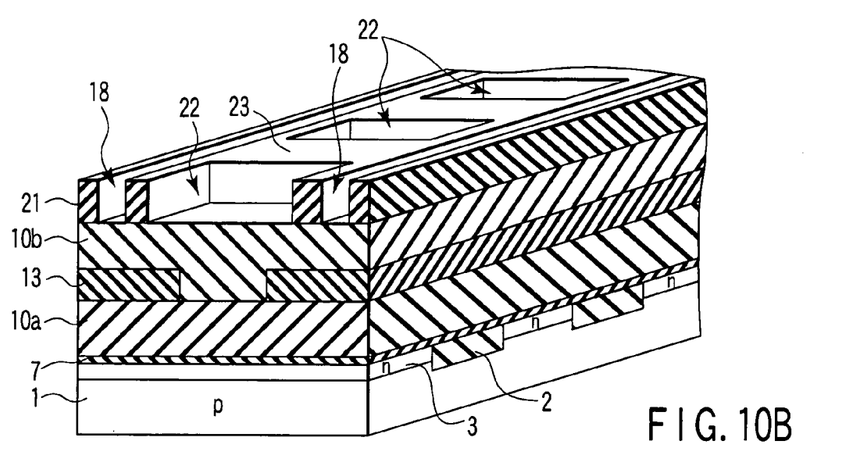
Figure 10C:
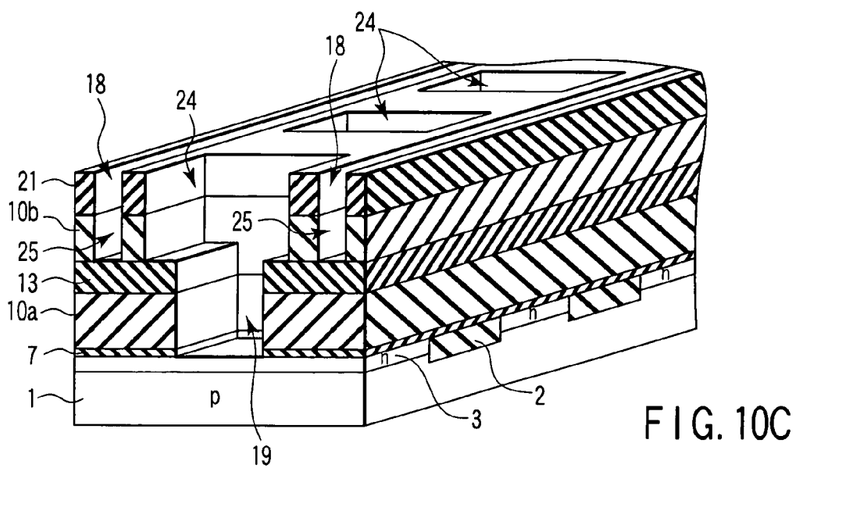

A step of forming each fine contact hole based on the manufacturing method of a semiconductor device according to Embodiment 3 will be first explained with reference to FIGS. 10A, 10B, and 10C. FIGS. 10A to 10C are perspective views showing how to form each contact hole and each interconnection groove in a part of a cross section taken along the line I-I in FIG. 1.

As shown in FIG. 10A, a first interlayer insulating layer 10a is formed on a silicon substrate having stripe-like n-type diffusion layers 3 through a barrier insulating film 7. Additionally, a first mask layer 13 made up of a silicon nitride film or the like is formed on the first interlayer insulating layer 10a. A first linear opening pattern 14 having a width of approximately 90 nm and extending in a word line WL direction is formed in the first mask layer 13 by, e.g., a photolithography method. At this time, the first mask layer 13 has an etching selectivity with respect to the first interlayer insulating layer 10a.

Then, as shown in FIG. 10B, a second interlayer insulating layer 10b is formed on the first interlayer insulating layer 10a and the first mask layer 13. As this second interlayer insulating layer 10b, a silicon oxide film, silicate glass, e.g., BPSG (boron phosphor silicate glass) or PSG (phosphor silicate glass), HSQ (Hydrogen Silsesquioxane), or SiLK (manufactured by Dow Chemical Company) is used. In order to prevent the first mask layer 13 functioning as a mask when forming each contact hole from being removed by etching of the second interlayer insulating layer 10b, a material having an etching selectivity with respect to the first mask layer 13 is used for the second interlayer insulating layer 10b.

Further, a photoresist layer as an interconnection pattern formation mask layer 21 is formed on the second interlayer insulating layer 10b. A plurality of linear interconnection groove opening patterns 22 that are perpendicular to the linear opening pattern 14 are formed in parallel in this interconnection pattern formation mask layer 21 by a lithography method. Furthermore, dummy opening patterns 18 are formed on both end sides of each pattern remaining region 23 between the interconnection groove opening patterns 22 in close proximity to the interconnection groove opening patterns 22.

Subsequently, as shown in FIG. 10C, the second interlayer insulating layer 10b below the interconnection groove opening patterns 22 that are not masked by the interconnection pattern formation mask layer 21 are etched by anisotropic etching, e.g., RIE, thereby forming each interconnection groove 24. Moreover, the first interlayer insulating layer 10a and the barrier insulating film 7 that are not masked by the first mask layer 13 and the interconnection pattern formation mask layer 21, i.e., below intersecting portions (overlap portions) of the linear opening pattern 14 and the interconnection groove opening patterns 22 are etched, thereby forming each contact hole 19.

At this time, when a material that does not have an etching selectivity with respect to the first interlayer insulating layer 10a is used for the second interlayer insulating layer 10b, the second interlayer insulating layer 10b and the first interlayer insulating layer 10a can be collectively etched. As a result, a labor of separately etching the first interlayer insulating layer 10a and the second interlayer insulating layer 10b can be eliminated.

Additionally, at this etching step, since a stress concentrated on each pattern remaining region 23 between the interconnection groove opening patterns 22 can be alleviated by the dummy opening patterns 18, each interconnection groove opening pattern 22 can be prevented from being distorted. Therefore, the fine contact holes that are formed to be aligned in the word line WL direction can be formed with a desired size, and they can correspond respectively to a plurality of element regions formed into a stripe pattern in the silicon substrate 1.

Figure 11A:
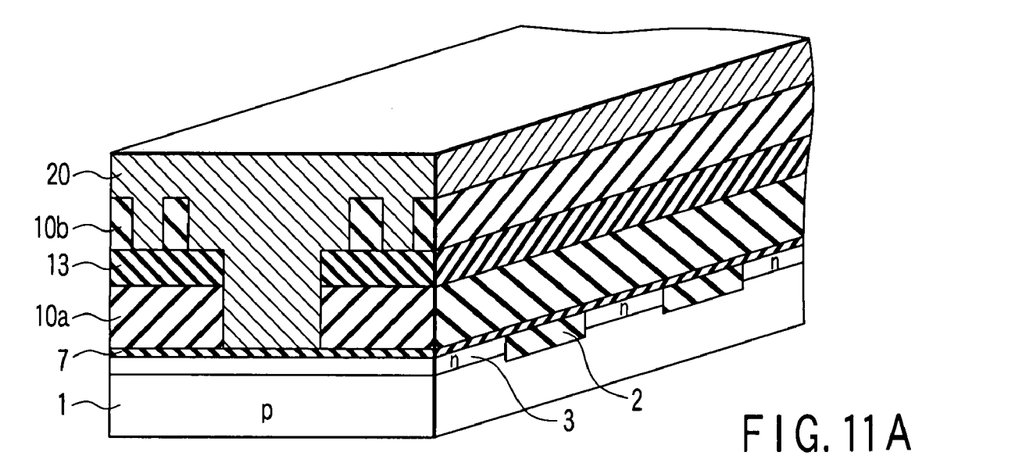
FIGS. 11A and 11B are cross-sectional views of a second step showing the manufacturing method of a semiconductor device according to Embodiment 3.
Figure 11B:
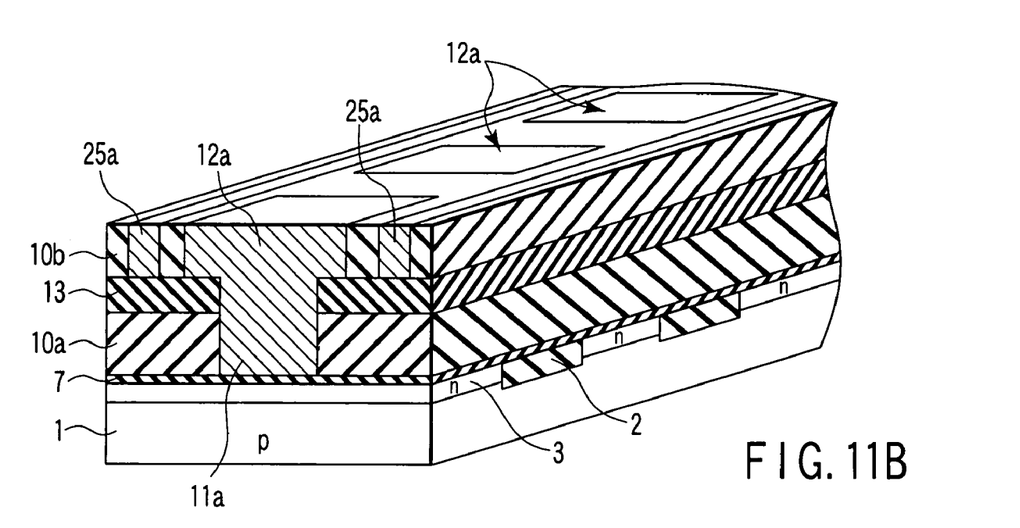

A step of forming each contact plug and each interconnection layer will now be explained with reference to FIGS. 11A and 11B. FIGS. 11A and 11B are perspective views showing how to form each contact plug and each interconnection layer in a part of a cross section taken along the line I-I in FIG. 1.

First, the interconnection pattern formation mask layer 21 is ashed. Then, as shown in FIG. 11A, a conductive layer 20 made of a metal material, e.g., tungsten, aluminum, copper or the like or a polycrystal silicon in which an impurity, e.g., phosphor is doped at a high concentration is embedded in each exposed part of the contact hole 19, the interconnection groove 24, and the first mask layer 13 through a barrier metal (not shown), e.g., Ti, Ta, TaN, or TiN by a CVD method and the like.

Further, as shown in FIG. 11B, the conductive layer 20 above each interconnection groove 24 is polished and removed by CMP to expose the second interlayer insulating layer 10b, and the contact plugs 11a and the interconnection layers 12a that are aligned in the word line WL direction are simultaneously formed. Furthermore, at this time, the conductive layer 20 is embedded in each groove 25 of the interlayer insulating layer 10b etched by each dummy opening patterns 18 of the interconnection pattern formation mask layer 21 to form each embedded layer 25a of the conductive layer 20. However, this embedded layer 25a is not a portion having a function of a semiconductor device, especially an electrical function. Therefore, this embedded layer 25a is formed as a floating layer electrically insulated from the interconnection layer 12a, a bit line BL, and others by covering this embedded layer 25a with, e.g., an insulating layer.

As explained above, according to the manufacturing method of a semiconductor device of this embodiment, in a semiconductor device where a plurality of contact holes and interconnection layers are linearly and regularly aligned, e.g., an NAND type EEPROM in particular, the contact holes, the contact plugs, and the interconnection layers with less distortion can be formed. Further, since the contact plugs and the interconnection layers can be simultaneously formed, the contact plugs and the interconnection layers can be readily formed as compared with Embodiments 1 and 2.

Embodiment 4

How to form each fine contact hole, each contact plug, and each interconnection layer based on the manufacturing method of a semiconductor device according to Embodiment 4 of the present invention will now be explained. Although structures of a second mask layer and an interconnection pattern formation mask layer in this embodiment are different from those in the manufacturing method of a semiconductor device according to each of Embodiments 1 to 3, each fine contact hole, each contact plug, and each interconnection layer are formed at the same steps. Therefore, the second mask layer alone that is different from those in Embodiments 1 to 3 will be explained with reference to FIG. 12.

Figure 12:
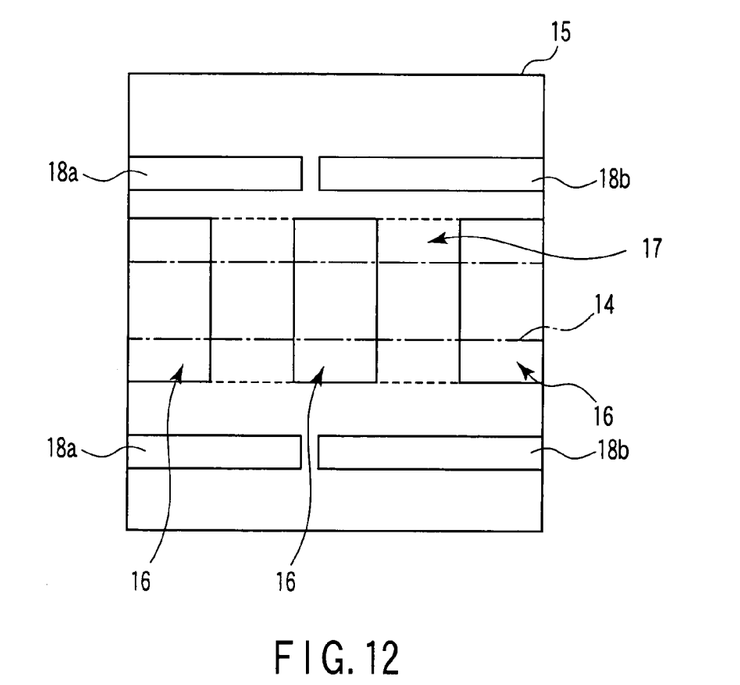
FIG. 12 is a plan view of a mask layer in a manufacturing method of a semiconductor device according to Embodiment 4 of the present invention.

FIG. 12 is a plan view showing the second mask layer in the manufacturing method of a semiconductor device according to this Embodiment 4. In Embodiments 1 and 2, the dummy opening patterns 18 of the second mask layer 15 are formed with a structure of the pair of linear opening patterns sandwiching all the pattern remaining regions 17. However, in Embodiment 4, as shown in FIG. 12, the dummy opening pattern 18 is modified into a shape divided into, e.g., a plurality of linear dummy opening patterns 18a and 18b. At this time, the linear dummy opening patterns 18a and 18b as the dummy opening patterns are provided in close proximity to ends of each pattern remaining region 17.

Even if the second mask layer 15 used in the manufacturing method of a semiconductor device according to each of Embodiments 1 and 2 is substituted by the second mask layer having the dummy opening patterns 18a and 18b depicted in FIG. 12, a stress concentrated on each pattern remaining region 17 can be transmitted to the dummy opening patterns 18a and 18b since the linear opening patterns 18a and 18b as the dummy opening patterns are close to the ends of each pattern remaining region 17 when, e.g., etching a first interlayer insulating layer 10a and a barrier insulating film 7. As a result, second linear opening patterns 16 can be prevented from being distorted.

Furthermore, likewise, the pair of linear dummy opening patterns 18 formed in the interconnection pattern formation mask layer 21 used in the manufacturing method of a semiconductor device according to each of Embodiments 1 to 3 can be modified into the divided linear dummy opening patterns 18a and 18b. Even in this case, when the dummy opening patterns 18a and 18b are arranged in close proximity to each pattern remaining region 23 between the interconnection groove opening patterns 22, a stress concentrated on each pattern remaining region 23 is alleviated, thereby preventing each interconnection groove opening pattern 22 from being distorted.

It is to be noted that the structure where the dummy opening patterns 18, 18a, or 18b in each embodiment are provided in close proximity to ends of each pattern remaining region 17 or 23 of the second mask layer 15 or the interconnection pattern formation mask layer 21 can suffice, and the dummy opening pattern may have any other shape.

Figure 13:
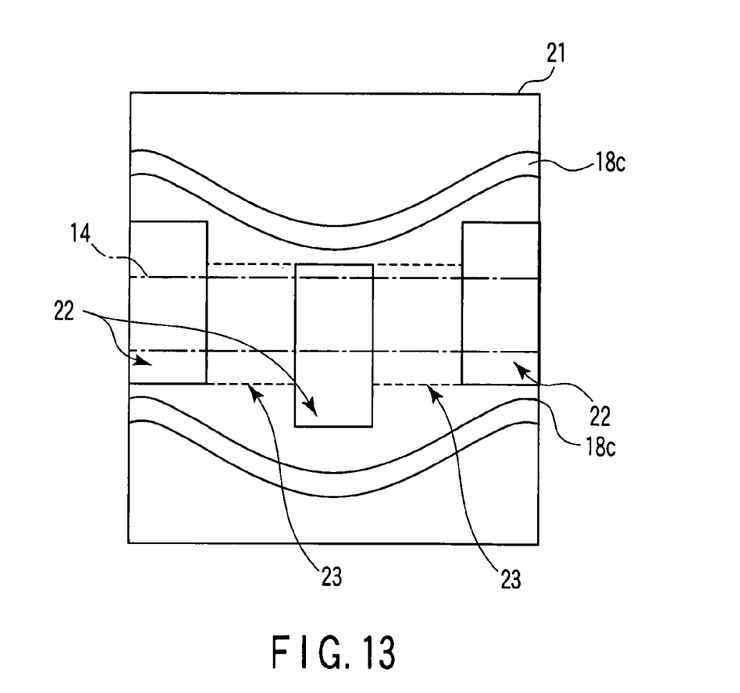
FIG. 13 is a plan view of another mask layer in the manufacturing method of a semiconductor device according to Embodiment 4 of the present invention.

For example, FIG. 13 is a plan view showing an example of the interconnection pattern formation mask layer 21. When ends of interconnection groove opening patterns 22 adjacent to each other are formed in a zigzag pattern along the bit line BL direction, curved dummy opening patterns 18c may be formed in the interconnection pattern formation mask layer 21 in close proximity to ends of each pattern remaining region 23 of the interconnection pattern formation mask layer 21.

According to the embodiment of the present invention, the manufacturing method of the semiconductor memory device and the semiconductor device including fine holes having a desired shape with less distortion can be provided. The present invention is not restricted to each of the foregoing embodiments, and can be modified and carried out in many ways without departing from the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
    forming a first mask layer having a first linear opening pattern above a first interlayer insulating layer;
    forming a second mask layer having a plurality of second linear opening patterns and first dummy opening patterns above the first mask layer, the plurality of second linear opening patterns being aligned above the first linear opening pattern at given intervals to cross the first linear opening pattern, the first dummy opening patterns being arranged in close proximity to a first pattern remaining region that is present between the second linear opening patterns adjacent to each other; and
    etching the first interlayer insulating layer that is present below opening patterns obtained by overlap portions of the first linear opening pattern and the second linear opening patterns to form holes.

2. The manufacturing method of a semiconductor device according to claim 1, further comprising:
 removing the second mask layer after forming the holes;
 forming a first conductive layer in the holes and above the first mask layer; and
 polishing and removing the first conductive layer and the first mask layer except the inside of each hole.

3. The manufacturing method of a semiconductor device according to claim 1, further comprising:
 removing the first mask layer and the second mask layer after forming the holes;
 forming a first conductive layer in the holes and above the first interlayer insulating layer; and
 polishing and removing the first conductive layer except the inside of each hole.

4. The manufacturing method of a semiconductor device according to claim 1, further comprising:
 forming conductive plugs in the holes and removing the first mask layer and the second mask layer;
 forming a second interlayer insulating layer above the first interlayer insulating layer and the conductive plugs;
 forming a third mask layer having a plurality of third linear opening patterns and second dummy opening patterns above the second interlayer insulating layer, the plurality of third linear opening patterns being aligned above the conductive plugs to overlap patterns of the conductive plugs respectively, the second dummy opening patterns being arranged in close proximity to a second pattern remaining region that is present between the third linear opening patterns adjacent to each other;
 etching the second interlayer insulating layer that is present below the third linear opening patterns to form interconnection grooves;
 forming a conductive layer in the interconnection grooves and above the second interlayer insulating layer; and
 polishing and removing the conductive layer except the inside of each interconnection groove.

5. The manufacturing method of a semiconductor device according to claim 1,
 wherein the first dummy opening patterns are arranged at both ends of the first pattern remaining region to sandwich the first pattern remaining region.

6. The manufacturing method of a semiconductor device according to claim 1,
 wherein a plurality of first pattern remaining regions are present between the plurality of second linear opening patterns, and
 the first dummy opening patterns are arranged along both ends of each of the plurality of first pattern remaining regions to sandwich the plurality of first pattern remaining regions.

7. The manufacturing method of a semiconductor device according to claim 3,
 wherein the first mask layer and the second mask layer are removed by ashing.

8. The manufacturing method of a semiconductor device according to claim 6,
 wherein each of the first dummy opening patterns arranged along both ends of each of the plurality of first pattern remaining regions is divided into a plurality of opening patterns.

9. The manufacturing method of a semiconductor device according to claim 6,
 wherein each of the first dummy opening patterns arranged along both ends of each of the plurality of first pattern remaining regions is formed into a linear shape.

10. The manufacturing method of a semiconductor device according to claim 6,
 wherein each of the first dummy opening patterns arranged along both ends of each of the plurality of first pattern remaining regions is formed into a curved shape.

11. A manufacturing method of a semiconductor device, comprising:
 forming a first mask layer having a first linear opening pattern above a first interlayer insulating layer;
 forming a second interlayer insulating layer above the first interlayer insulating layer below the first linear opening pattern and above the first mask layer;
 forming a second mask layer having a plurality of interconnection groove opening patterns and dummy opening patterns above the second interlayer insulating layer, the plurality of interconnection groove opening patterns being aligned above the first linear opening pattern at given intervals to cross the first linear opening pattern, the dummy opening patterns being arranged in close proximity to a pattern remaining region that is present between the interconnection groove opening patterns adjacent to each other; and
 etching the second interlayer insulating layer below the interconnection groove opening patterns to form interconnection grooves, and etching the first interlayer insulating layer that is present below opening patterns obtained by overlap portions of the first linear opening pattern and the interconnection groove opening patterns to form holes.

12. The manufacturing method of a semiconductor device according to claim 11, further comprising:
 removing the second mask layer after forming the holes;
 forming a conductive layer in the holes and above the first mask layer and the second interlayer insulating layer; and
 polishing and removing the conductive layer above the second interlayer insulating layer.

13. The manufacturing method of a semiconductor device according to claim 11,
 wherein the dummy opening patterns are arranged at both ends of the pattern remaining region to sandwich the pattern remaining region.

14. The manufacturing method of a semiconductor device according to claim 11,
 wherein a plurality of pattern remaining regions are present between the plurality of interconnection groove opening patterns, and
 the dummy opening patterns are arranged along both ends of each of the plurality of the pattern remaining regions to sandwich the plurality of pattern remaining regions.

15. The manufacturing method of a semiconductor device according to claim 14,
 wherein each of the dummy opening patterns arranged along both ends of each of the plurality of pattern remaining regions is divided into a plurality of opening patterns.

16. The manufacturing method of a semiconductor device according to claim 14,
 wherein each of the dummy opening patterns arranged along both ends of each of the plurality of pattern remaining regions is formed into a linear shape.

17. The manufacturing method of a semiconductor device according to claim 14,
 wherein each of the dummy opening patterns arranged along both ends of each of the plurality of pattern remaining regions is formed into a curved shape.

18. A manufacturing method of a semiconductor memory device, comprising:

forming a memory cell array on a semiconductor substrate;

forming a first interlayer insulating layer above the semiconductor substrate having the memory cell array thereon;

forming a first mask layer having a first linear opening pattern above the first interlayer insulating layer;

forming a second mask layer having a plurality of second linear opening patterns and first dummy opening patterns above the first mask layer, the second linear opening patterns intersecting the first linear opening pattern when viewed from above, the first linear opening pattern and the second linear opening patterns being arranged such that overlap portions as viewed from above correspond to a position where contact plugs are formed on the memory cell array, the first dummy opening patterns being arranged in close proximity to a pattern remaining region that is present between the second linear opening patterns adjacent to each other; and etching those portions of the first interlayer insulating layer which are present at the overlap portions between the first linear opening pattern and the second linear opening patterns, to form contact holes.

19. The manufacturing method of a semiconductor memory device according to claim 18, wherein the first linear opening pattern extends in a word line direction of the memory cell array, the second linear opening patterns extend in a direction orthogonal to the word line direction, and the contact holes are aligned in the word line direction.

20. The manufacturing method of a semiconductor memory device according to claim 18, wherein the first dummy opening patterns are arranged at both ends of the pattern remaining region to sandwich the pattern remaining region.

\* \* \* \* \*